United States Patent
Huckerby

(10) Patent No.: US 10,452,809 B2
(45) Date of Patent: Oct. 22, 2019

(54) ADAPTIVE REPAIR METHOD FOR AEROFOIL BLADES

(71) Applicant: ROLLS-ROYCE plc, London (GB)

(72) Inventor: Karl S. Huckerby, Derby (GB)

(73) Assignee: ROLLS-ROYCE plc, London (GB)

( * ) Notice: Subject to any disclaimer, the term of this patent is extended or adjusted under 35 U.S.C. 154(b) by 178 days.

(21) Appl. No.: 15/493,192

(22) Filed: Apr. 21, 2017

(65) Prior Publication Data

US 2017/0316146 A1    Nov. 2, 2017

(30) Foreign Application Priority Data

Apr. 29, 2016  (GB) .................................. 1607462.7

(51) Int. Cl.
  *G06G 7/48* (2006.01)
  *G06F 17/50* (2006.01)
  *G05B 19/401* (2006.01)

(52) U.S. Cl.
  CPC ....... *G06F 17/5086* (2013.01); *G05B 19/401* (2013.01); *G06F 17/5009* (2013.01); *G05B 2219/45147* (2013.01); *Y02P 90/265* (2015.11)

(58) Field of Classification Search
  None
  See application file for complete search history.

(56) References Cited

U.S. PATENT DOCUMENTS

| 8,844,132 B2 * | 9/2014 | Blais | B23C 3/18 29/557 |
|---|---|---|---|
| 2003/0033041 A1 | 2/2003 | Richey | |
| 2004/0057057 A1 * | 3/2004 | Isaacs | G01B 11/24 356/601 |
| 2005/0171733 A1 * | 8/2005 | Hough | G01B 21/04 702/182 |
| 2007/0251072 A1 | 11/2007 | Beeson et al. | |
| 2009/0306930 A1 * | 12/2009 | Cameron | F01D 5/141 702/167 |
| 2011/0099810 A1 * | 5/2011 | Stankowski | B22F 7/062 29/888 |
| 2011/0264413 A1 * | 10/2011 | Stankowski | B23P 6/005 703/1 |
| 2014/0041183 A1 | 2/2014 | Rangarajan et al. | |

(Continued)

FOREIGN PATENT DOCUMENTS

EP    3009903    4/2016

OTHER PUBLICATIONS

Gao, Jian et al., "Investigation of a 3D Non-Contact Measurement based Blade Repair Integration System", 2005, Aircraft Engineering and Aerospace Technology: An International Journal, Emerald Group Publishing Limited. (Year: 2005).*

(Continued)

*Primary Examiner* — Cedric Johnson
(74) *Attorney, Agent, or Firm* — Shumaker & Sieffert, P.A.

(57) ABSTRACT

This disclosure concerns an adaptive repair method, for example for aerofoil blade components. The method generates a digitized model of a physical component and uses data from the digitized model to align a part of the physical component with a nominal CAD model of the component. A combination of the digitized data and data from the nominal CAD model are then used to create an adapted model for repair of the component.

20 Claims, 5 Drawing Sheets

(56) References Cited

U.S. PATENT DOCUMENTS

2014/0257543 A1    9/2014   Rhodes et al.
2016/0292308 A1*  10/2016   Huckerby .............. G06F 17/50

OTHER PUBLICATIONS

Ronzheimer, A., "Aircraft Geometry Parameterization with High-End CAD-Software for Design Optimization", Sep. 10-14, 2012, European Congress on Computational Methods in Applied Sciences and Engineering. (Year: 2012).*
Gao, Jian et al., "Adaptive Restoration of Complex Geometry Parts through Reverse Engineering Application", Jun. 13, 2006, Advances in Engineering Software 37, Elsevier Ltd. (Year: 2006).*
European Search Report dated Sep. 28, 2017 issued in EP Patent Application No. 17164735.
Response to Extended Search Report dated Sep. 28, 2017, from counterpart European Application No. 17164735.7, filed Apr. 25, 2018, 4 pp.
Great Britain Search Report dated Oct. 31, 2016 issued in GB Patent Application No. 1607462.7.

\* cited by examiner

ADAPTIVE REPAIR METHOD FOR AEROFOIL BLADES

CROSS-REFERENCE TO RELATED APPLICATIONS

This application is based upon and claims the benefit of priority from British Patent Application Number 1607462.7 filed 29 Apr. 2016, the entire contents of which are incorporated by reference.

BACKGROUND

1. Field of the Disclosure

The present disclosure relates to the repair/maintenance of aero engine components. More particularly, the disclosure relates to the 'in-service' repair of aerofoils for compressor blades and bladed disks.

2. Description of the Related Art

It is known that the original shape and profile of compressor aerofoils can change during routine in-service operation, and it is envisaged that this phenomenon may also affect compressor bladed disk aerofoils. Furthermore, each bladed disk component that is a candidate for repair will have experienced idiosyncratic in-service operating conditions and respective damage. Individual components will thus be unique in geometry and will require tailored measurement, material addition, machining and finishing processes.

As a result of the unique size and/or shape of each component, the repair operation requires processes that can adapt to the individual components and compensate for the variations to the manufactured condition.

Conventional methods of repairing these components requires highly skilled labour to "hand craft" each individual repair through a process of sentencing, cleaning, material addition and re-profiling.

Whilst these repair methods do work they are slow, expensive and are highly dependent on the skill of the craftsmen involved.

The term "adaptive repair" is used to describe manufacturing and repair processes that can adapt automatically to variations in the size and shape of the component. The amount of variation is determined by taking various measurements of the actual component and comparing these measurements with the "nominal" design specification.

For example, US2006/090336 relates to an adaptive machining and weld repair process. The process described in US2006/090336 first machines away damaged portions of an aerofoil. Filler material is then added to the machined area through a process such as laser welding. At this point, the actual profile of the welded aerofoil is measured using a Coordinate Measuring Machine. This data is then used to generate a "deformation" profile, an aerofoil profile that approximates the ideal shape of the aerofoil. The aerofoil is then machined using the data of the deformation profile to produce that shape. The adaptive technology minimizes the amount of stock on material that needs to be removed by hand. The technique thereby significantly reduces costly manual processing.

There are many different possible ways to measure a component, but in the field for which this invention is intended it is generally accepted that there are two basic types of measurement:

Contact Measurement, which will generally be accomplished with a touch trigger probe for example on a Co-ordinate Measuring Machine (CMM), and Non-Contact Measurement, which can be accomplished by optical digitising using various light sources.

These two systems can be used to create a three dimensional electronic model of the actual component which can then be compared with a "nominal" Computer Aided Design (CAD) model of the component.

If the nominal CAD model of the component is constructed using parametric modeling, then the actual measured values obtained can replace the corresponding nominal parametric values and the size and shape of the component can be changed and updated automatically. This is an accepted and recognized approach and there are many competing concepts and numerous patents for adaptive modeling and machining in existence. These concepts describe various methods to deal with the measurement of the component and subsequent creation of an adaptive model which is used for manufacturing processes such as machining.

However, prior art methods do not consider what to do in an area where there is no measurement data, for example in a repair process where the component is damaged and material is missing.

It is an aim of the present disclosure to provide an improved adaptive repair method which better accounts for areas of missing material and helps to improve the efficiency of a repair process.

OBJECTS AND SUMMARY

According to a first aspect of the disclosure there is provided an adaptive repair method comprising the steps of creating a digitized model of a base portion of a physical component, aligning a corresponding base portion of a nominal CAD model of said component with the digitized model such that the nominal model extends beyond the digitized model used for alignment, extracting a set of coordinate points from the aligned nominal model and lofting a cross-sectional profile based on the measured profile of the base portion along a path defined by the coordinate points of the aligned nominal model to create a modified model for repair of the component.

The digitized model may be produced using a contact/touch probe, for example in a coordinate measuring machine (CMM), or by optical means such as structured light scanning, or using any other suitable contact or non-contact measurement method or system known to one skilled in the art.

The digitized model may be created by digitising an entire component and electronically cutting back the resulting model to a predetermined crop plane.

Alternatively, the physical component may be physically cut back before digitizing to create the digitized model of the base portion.

The cross-sectional profile may be adapted to create an oversized material addition region for a material addition step in the adapted model.

The adapted model may include tool path data within the oversized material addition region for a re-profiling step in the repair process.

The repair method may further comprise the step of adding material to the component based on the adapted model.

The repair method may further comprise the step of machining the component based on the adapted model.

The component may be an aerofoil blade and the co-ordinate points may comprise points at the leading edge and/or trailing edge of the blade, and/or points on the concave and/or convex surfaces of the blade.

The co-ordinate points may be located in a number of planes, at least one of said planes intersecting the digitized model of the base portion, and at least one plane being located beyond the digitized model of the base portion. At least one plane is therefore provided above the crop plane and one below.

At least five, ten or fifteen planes may be located beyond the digitized model of the base portion and/or at least two or three planes may intersect the digitized model of the base portion. For example, four planes may intersect the digitized model of the base portion and seventeen planes may be located beyond the digitized model of the base portion.

The disclosure extracts co-ordinates from a measured point cloud, and can then control an adaptive parametric CAD model. The model can be used for creating either material addition (MA) CAD geometry, or the machining CAD surfaces required to 5-axis mill a new blade profile. The models can then be used to generate Siemens™ NXCAM generated Machine code for either MA or machining. Any blade can be repaired on any stage of the drum.

In contrast to known techniques, the model is "stitched" to measured stub. Actual deposited material (not measured and nominal points) are used for both the material addition part and the re-profiling, providing advantages in speed and processing time.

In addition, the build and type of certain engines mean that their blades or bladed disks require a full chord repair, rebuilding a full aerofoil from material addition before re-profiling. The present disclosure enables blending back to nominal geometry for the majority of the re-build aerofoil. The improved model can also be used in both material addition and re-profiling operations by activating or de-activating certain features within the model to suit. The blend region in the repair can be also applied over a full aerofoil section.

Wherever practicable, any of the essential or preferable features defined in relation to any one aspect of the disclosure may be applied to any further aspect. Accordingly the disclosure may comprise various alternative configurations of the features defined above.

BRIEF DESCRIPTION OF THE DRAWINGS

Practicable embodiments of the disclosure are described in further detail below by way of example only with reference to the accompanying drawings, of which.

DETAILED DESCRIPTION OF EMBODIMENTS

FIGS. 1A to 1D illustrate the steps of a typical repair process on a component 20. At each stage of the process highly skilled labour is required to perform each task to the required standards for aero engine repairs.

Figures 1A, 1B, 1C, 1D:
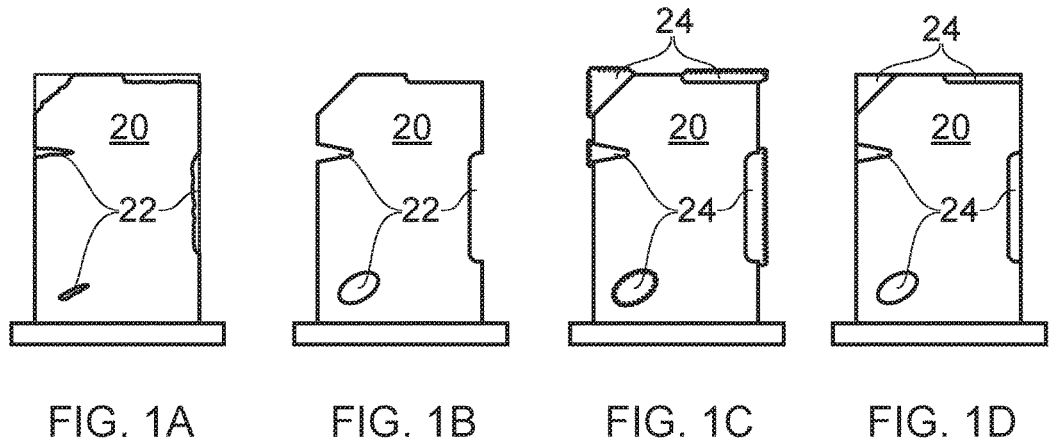
FIG. 1A to 1D show the steps of a prior art repair process.

The first step, shown in FIG. 1A, is sentencing. This requires a skilled inspector to identify and classify the damaged area(s) 22 of the component 20. The component 20 is the cleaned, as illustrated in FIG. 1B, to prepare the damaged area(s) 22 for material addition. FIG. 1C shows the result of the material addition step, the process of filling in the damaged area(s) 22, which is usually accomplished with welding 24 by a highly skilled welder. Finally, the result of dressing back the weld(s) 24 to restore the aerofoil surface, re-profiling, is illustrated in FIG. 1D. Again, this step requires a high level of skill.

Figure 2:
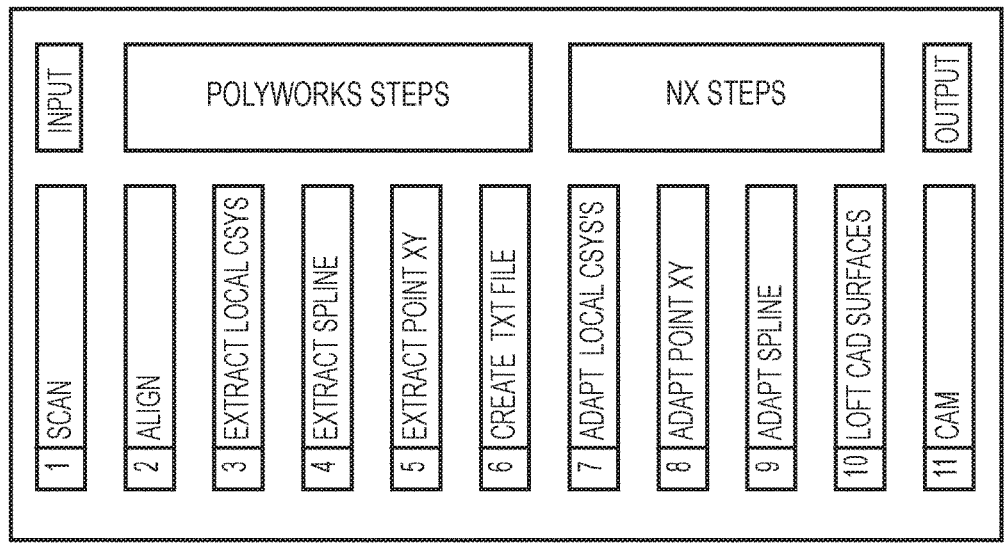
FIG. 2 shows the basic process steps of the present disclosure.

FIG. 2 sets out the process steps of the present disclosure in their most basic form. The steps apply for both material addition (MA) and re-machining operations.

In the example of FIG. 2, the adaptive repair process has been created using the following commercially available software from the following vendors:

Innovmetric's Polyworks™ Inspector 11.0, and
Siemens™ NX 7.5.

FIG. 2 shows which steps of the CADCAM process between hardware focused operations (scanning and machining) are performed with Polyworks™ Inspector 11.0 (Polyworks™ Steps) and which are performed with NX 7.5 (NX Steps). It should be understood, however, that similar software from alternative suppliers could be used without departing from the inventive concept. The steps in FIG. 2 are numbered 1 to 11, and will be described below with reference to the further Figures as appropriate.

Figure 3:
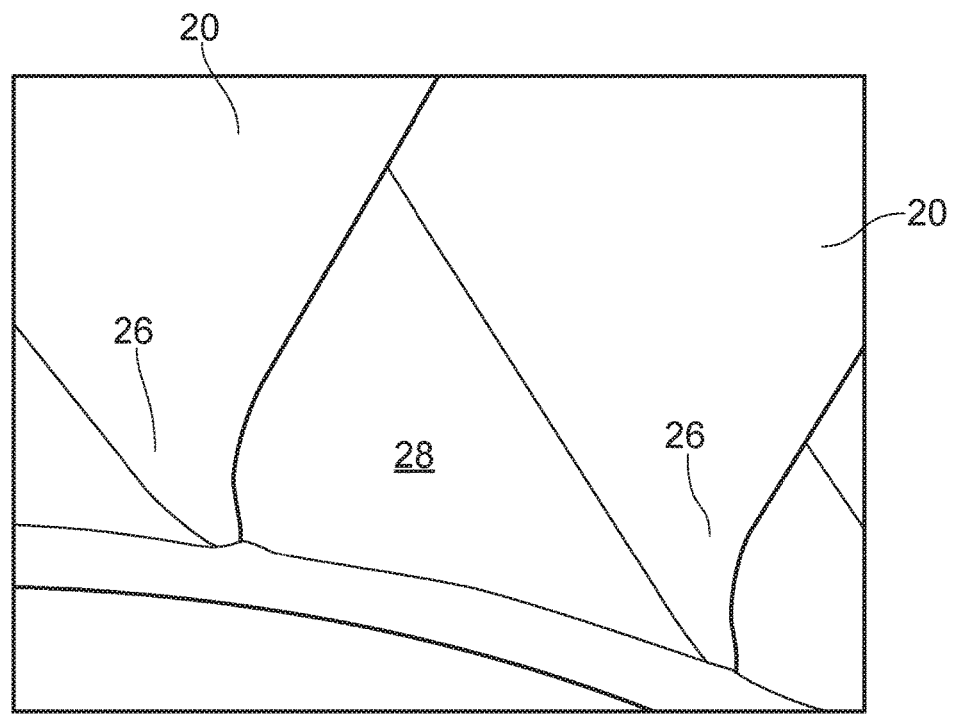
FIG. 3 shows the results of a high quality scan of a component.

In step 1 the component is scanned to obtain a high quality input scan of all datum features. The results of such a scan are shown in FIG. 3, where the hubs 26 of two aerofoil blades 20 are shown joined to a drum 28. Typically, a scan of an entire bladed drum 28 is produced and is then broken down into individual blade models. In instances requiring a full chord repair, where a necessary stage in the repair process is paring a damaged blade back to a hub before rebuilding a full aerofoil with material addition, the scan may be performed after the paring back operation has been performed.

Figure 4:
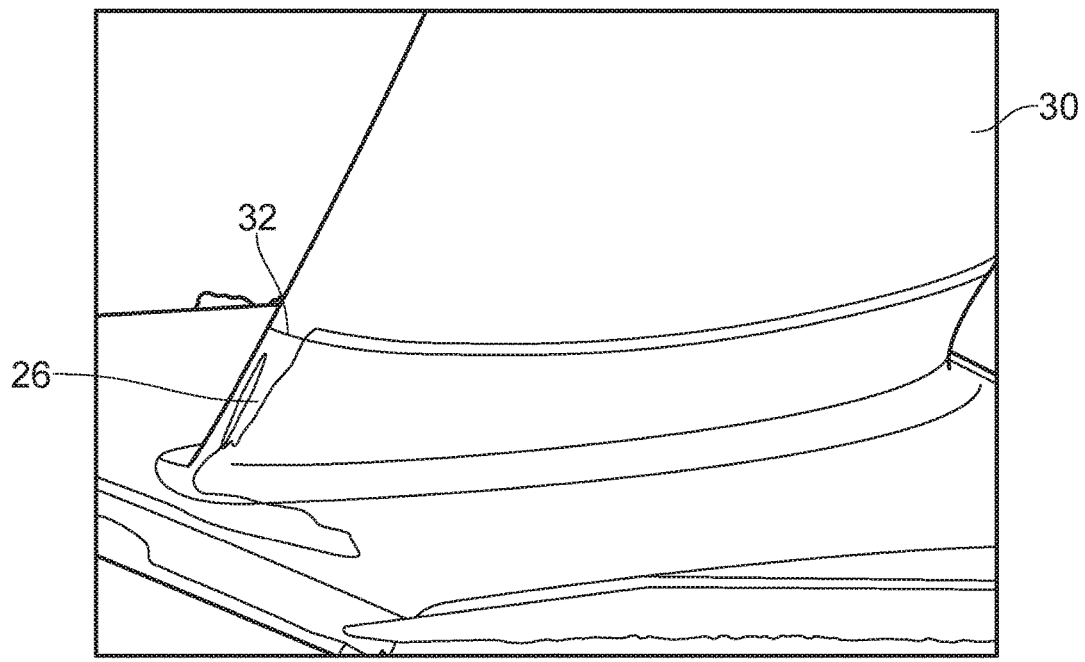
FIG. 4 shows the alignment of a nominal model of an aerofoil blade with a measured/digitized hub portion.

FIG. 4 shows step 2 of the process, where the scanned base/hub section 26 is aligned with a nominal CAD model 30 of the aerofoil blade. Where a scan of a complete blade 20 is performed in step 1, this scan is cut back at a predetermined crop plane 32 to leave only the hub section 26 for alignment purposes. The alignment is performed locally, and once complete the nominal model 30 of the aerofoil blade is extended to allow extraction above the real aerofoil.

Step 3 of the process is to extract local co-ordinate systems following the alignment. The aerofoil gauge of the nominal model 30 is determined and used to create leading edge point, plane vector and inlet angle. Plane-line-point geometry is extracted and a local co-ordinate system is created, measured relative to world. In order to ensure that all dimensions are positive, a 100 mm offset in both X and Y directions can be incorporated.

An NX readable co-ordinate file is exported detailing the local co-ordinate system locations. In this example, a total of twenty-one planes are included to provide various aerofoil gauges. Four of the planes are located below the crop plane 32 and seventeen above to allow blending.

In step 4, the aerofoil gauge used in step 3 extracts a two-dimensional cross section profile and a two-dimensional spline is created.

Figure 5:
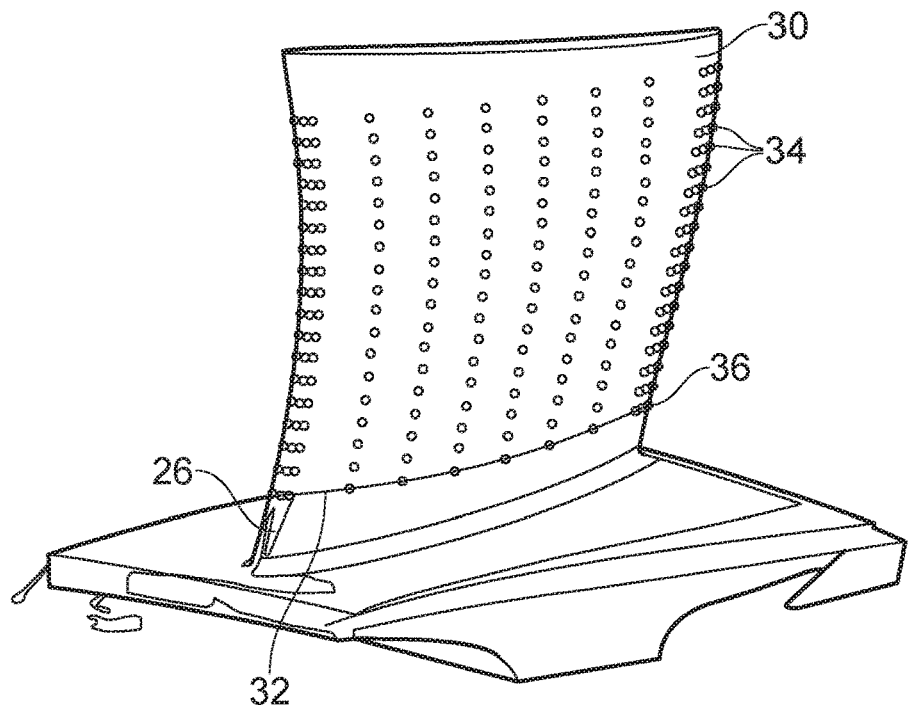
FIG. 5 shows the sampling of two-dimensional points from the aligned model.

FIG. 5 illustrates step 5 of the process, where the two-dimensional point coordinates are extracted from the aligned models. The aerofoil gauge capability of the Polyworks™ software is used to sample points from the cross section, and these points are converted into two-dimensional co-ordinates relative to the local co-ordinate system. Nominal points 34 from the nominal CAD model 30 are selected above the crop plane 32, and measured points 36 from the scanned hub 26 below.

The final Polyworks™ step, step 6 in FIG. 1, is to extract an NX readable text file for use in the NX steps of the process. The text file can include point co-ordinate specific data, eg section1_point1_CC_X=22.358 and/or an NX readable format expression file, eg=Vector(I,J,K).exp file.

In step 7, the NX readable text file created in step 6 is passed to the Siemens™ NX 7.5 software, where the local coordinate systems are adapted. The existing plane line point geometry is parametrically controlled and updated Step 8 is to adapt the two-dimensional points within the NX software. Existing nominal geometry is maintained within sketches 38 based on the measured cross-sections of the aerofoil hub 26. The parametric dimensioning 40 allows updating of the points without the risk of incorporating errors into related points or geometries.

Figure 6:
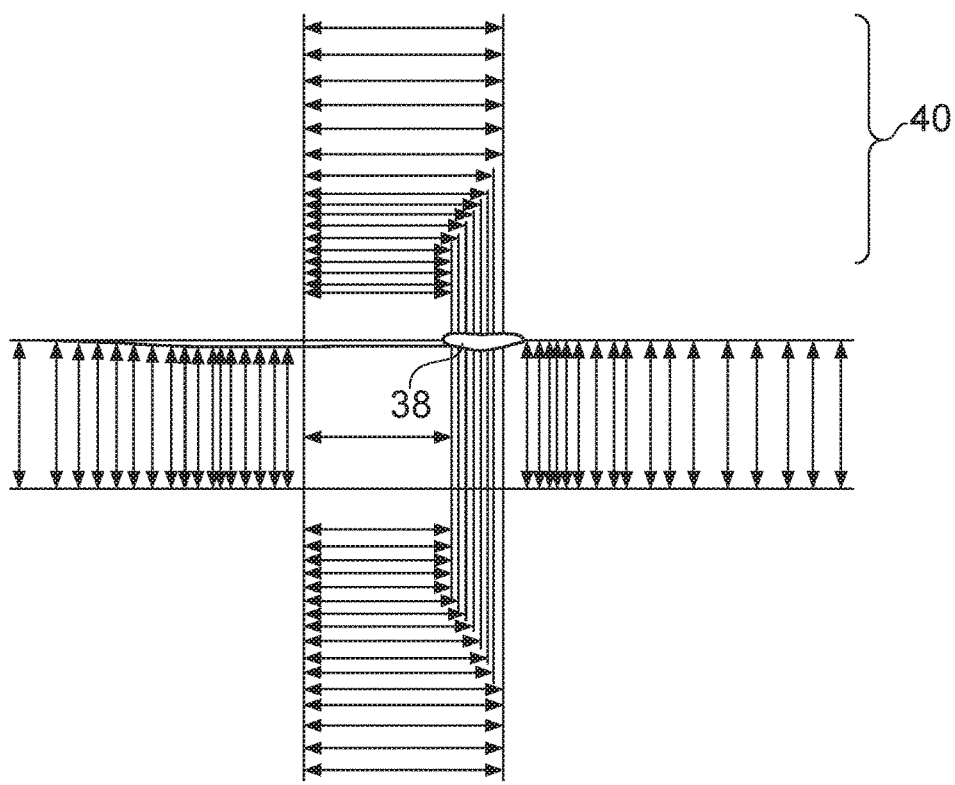
FIG. 6 shows the updating and dimensioning of the two-dimensional points.

Once the points have been updated, as shown in FIG. 6, step 9 of the process is to adapt the section two-dimensional spline. The cross-section spline is recreated in the NX software and is constrained to points split into leading edge, trailing edge, concave and convex surfaces. Splitting the surfaces in this way allows for material addition dwells for cooling on the leading edge and trailing edge.

Figure 7:
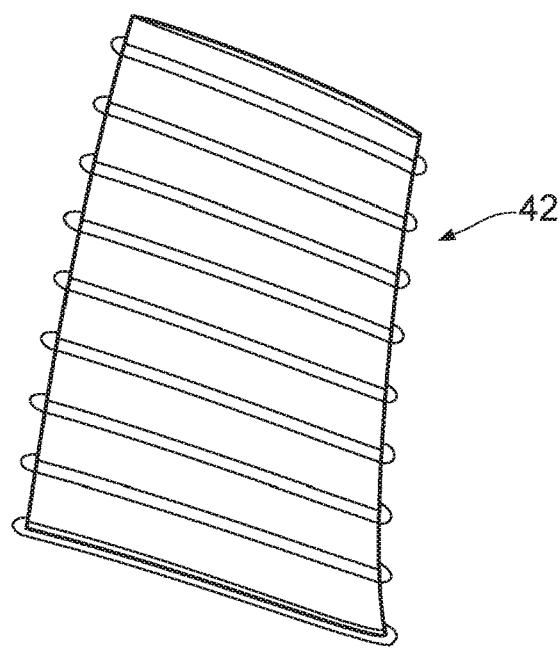
FIG. 7 shows a lofted CAD model formed from the updated two-dimensional points.

Step 10 is to generate a lofted CAD model 42 as shown in FIG. 7. Multiple adapted sketches 38 from step 9 are re-lofted to recreate aerofoil geometry, following paths defined by the nominal CAD model. The resulting model contains manufacturing offsets and metal for features by suppression.

Figure 8:
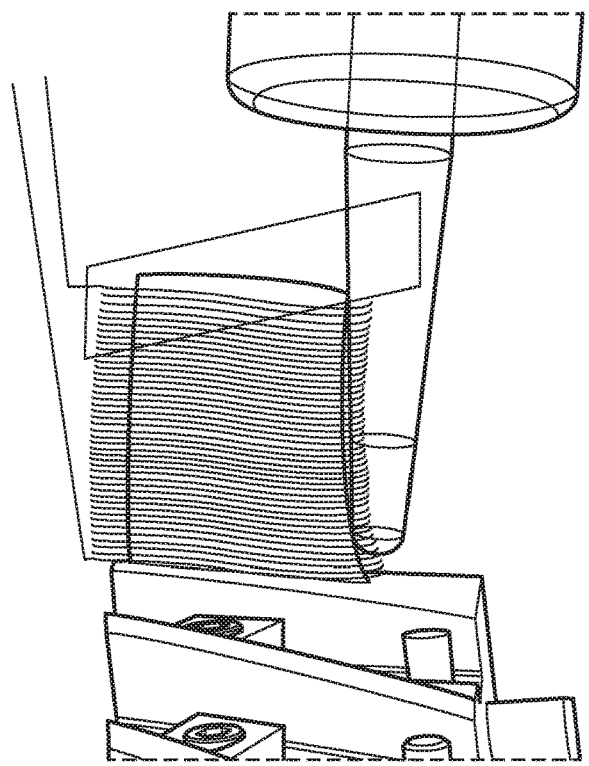
FIG. 8 shows an example of toolpaths created by the process of the disclosure.
Figure 9:
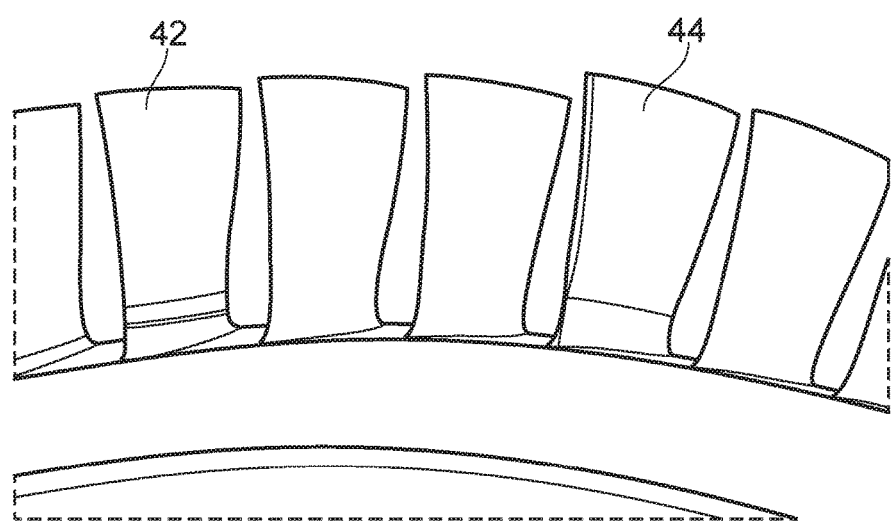
FIG. 9 shows two examples of the results of the process.

Finally, in step 11, the lofted CAD model 42 is output for the Computer Aided Manufacturing (CAM) process. Root blending is switched off for the purposes of material addition. Only planes four to twenty-one (ie the planes at and above the cut plane 32) are used. The cropping surface is moved radially to allow for excess tip material addition or re-cutting the tip diameter. FIG. 8 illustrates a stage of the CAM process. Associative toolpaths are created on nominal surfaces, and update to move with the new surfaces.

The embodiment above generally describes a repair process where a full chord rebuild is required. However, the disclosure also allows for other repairs/re-profiling of aerofoil blades. FIG. 8 illustrates a material addition 42 and re-profile adapted 44 CAD models on the same stage three drum scan.

The described disclosure provides a process that extracts co-ordinates from a measured point cloud, and controls an adaptive parametric CAD model. The model can be used for creating either material addition CAD geometry, or the machining CAD surfaces required to 5-axis mill a new blade profile. The models are then used to generate Siemens™ NXCAM generated machine code for either material addition or machining. Any blade can be repaired on any stage of the drum.

Of particular benefit is that one model can be used to provide adaptive CAD for both material addition and re-profiling (5 axis machining) operations, and full 3D aerofoil replacement is made possible. Similar technology has only previously been used to repair patches.

The nominal adaptive CAD aerofoil blade can be moved between stages of compressors. It can also deal cope with non-timed aerofoils using an appropriate local co-ordinate system, for example as defined in pending patent application GB 1505400.0.

In addition, it is possible for the toolpath for cropping to be adapted to ensure cutter access between aerofoils. This is an important consideration when repairing untimed aerofoils. A tang can also be left so that the blade does not fall onto the part. The process needs to be accurate because of the tang's small size. If too small, the blade might fall off. If too large, the operator may not be able to remove it when required.

Points can also be output on aerofoil surfaces for 5-axis on machine probing. This can be helpful when calculating any fine machine offsets or alignment overchecks.

For the avoidance of doubt, the disclosure is not considered to be limited to the specific example described above. Examples of some changes that may be made without departing from the inventive concept include:

Different software that can similarly interact (E.g. Replace NX with Catia™)

All points could have world references (X, Y and Z)

Variable offsets on regions of each cross section

Adding positional variation to machining CAD to allow for distortion in the additive material process Different metal removal techniques like polishing or EDM Different material addition techniques like CNC welding or powder bed Application of the process to items other than compressor blades (eg turbines or fan blades)

ELE re-profiling could also be integrated with this technology, allowing the improvement/repair of multiple aerofoils on an assembly (bladed disk or conventional) for performance reasons.

This process could also be used to create an adaptive 'condition of supply' CAD model for other CNC controlled additive material processes, such as MIG welding, powder deposition or sintering; or indeed in other material removal processes such as Electro-Discharge Machining, Waterjet and Linishing/polishing.

Finally, the process may be used to machine an aerofoil smaller than its current size, to remove surface damage or stress raisers like nicks/dents, rather than recreating a new aerofoil from deposited material. This could speed up repair times, particularly on multi-stage drums, by reducing the need to crop the blade off and redeposit material.

I claim:

1. An adaptive repair method comprising:
providing a digitized model of a base portion of a physical component;
aligning a corresponding base portion of a nominal CAD model of the physical component with the digitized model of the base portion of the physical component such that the nominal CAD model extends beyond the digitized model of the base portion of the physical component used for alignment;
extracting a set of co-ordinate points from the nominal CAD model once aligned;
lofting a cross-sectional profile based on a measured profile of the base portion along a path defined by the co-ordinate points of the nominal CAD model once aligned to the digitized model of the base portion of the physical component to create an adapted model for repair of the physical component; and adding material to the physical component based on the adapted model as part of adaptively repairing the physical component.

2. The adaptive repair method according to claim 1, wherein the digitized model of the base portion of the physical component is created by digitizing an entire component and electronically cutting back the resulting model to a predetermined crop plane.

3. The adaptive repair method according to claim 1, wherein the physical component is physically cut back before being digitized to create the digitized model of the base portion of the physical component.

4. The adaptive repair method according to claim 1, wherein the cross-sectional profile is adapted to create an oversized material addition region in the adapted model for adding material to the physical component.

5. The adaptive repair method according to claim 4, wherein the adapted model includes tool path data within the oversized material addition region for a reprofiling step in the adaptive repair method.

6. The adaptive repair method according to claim 1, further comprising machining the physical component based on the adapted model.

7. The adaptive repair method according to claim 1, wherein the physical component is an aerofoil blade and the co-ordinate points comprise points at the leading edge and/or trailing edge of the aerofoil blade.

8. The adaptive repair method according to claim 7, wherein the co-ordinate points comprise points on the concave and/or convex surfaces of the aerofoil blade.

9. The adaptive repair method according to claim 1, wherein the co-ordinate points are located in a number of planes, at least one of the planes intersecting the digitized model of the base portion of the physical component, and at least one plane being located beyond the digitized model of the base portion of the physical component.

10. The adaptive repair method according to claim 9, wherein at least ten planes are located beyond the digitized model of the base portion of the physical component.

11. The adaptive repair method according to claim 9, wherein at least three planes intersect the digitized model of the base portion of the physical component.

12. The adaptive repair method according to claim 9, wherein at four planes intersect the digitized model of the base portion of the physical component and seventeen planes are located beyond the digitized model of the base portion of the physical component.

13. An adaptive repair method comprising:
providing a component, a digitized model of a portion of the component, and an adapted model; and
adding material to the component based on the adapted model as part of adaptively repairing the component, wherein the adapted model is provided by:
aligning a corresponding portion of a nominal CAD model of the component with the digitized model of the base portion of the component such that the nominal CAD model extends beyond the digitized model of the portion of the component,
extracting a set of co-ordinate points from the aligned nominal CAD model, and
lofting a cross-sectional profile based on a measured profile of the portion along a path defined by the co-ordinate points of the aligned nominal CAD model to create the adapted model for repair of the component.

14. The adaptive repair method according to claim 13, further comprising machining the component based on the adapted model.

15. The adaptive repair method according to claim 13, wherein the digitized model of the portion of the component is created by digitizing an entire component and electronically cutting back the resulting model to a predetermined crop plane.

16. The adaptive repair method according to claim 13, wherein the component is physically machined before digitizing to create the digitized model of the portion of the component.

17. An adaptive repair method comprising:
providing a digitized model of a base portion of a physical component;
aligning a corresponding base portion of a nominal CAD model of the physical component with the digitized model of the base portion of the physical component such that the nominal CAD model extends beyond the digitized model used for alignment;
extracting a set of co-ordinate points from the aligned nominal CAD model; and
lofting a cross-sectional profile based on a measured profile of the base portion along a path defined by the co-ordinate points of the aligned nominal CAD model to create an adapted model for repair of the physical component; and
machining the physical component based on the adapted model.

18. The adaptive repair method according to claim 17, wherein the digitized model of the base portion of the physical component is created by digitizing an entire component and electronically cutting back the resulting model to a predetermined crop plane.

19. The adaptive repair method according to claim 17, wherein the physical component is physically machined before digitizing to create the digitized model of the base portion of the physical component.

20. The adaptive repair method according to claim 17, wherein the adapted model includes tool path data within an oversized material addition region for a reprofiling step in the repair process.

* * * * *